US010641449B2

(12) United States Patent
Albou

(10) Patent No.: US 10,641,449 B2
(45) Date of Patent: May 5, 2020

(54) LIGHTING AND/OR SIGNALLING DEVICE, MORE PARTICULARLY FOR AN AUTOMOTIVE VEHICLE

(71) Applicant: VALEO VISION, Bobigny (FR)

(72) Inventor: Pierre Albou, Bobigny (FR)

(73) Assignee: VALEO VISION, Bobigny (FR)

(*) Notice: Subject to any disclaimer, the term of this patent is extended or adjusted under 35 U.S.C. 154(b) by 0 days.

(21) Appl. No.: 16/313,181

(22) PCT Filed: Jun. 26, 2017

(86) PCT No.: PCT/EP2017/065659
§ 371 (c)(1),
(2) Date: Dec. 26, 2018

(87) PCT Pub. No.: WO2018/001938
PCT Pub. Date: Jan. 4, 2018

(65) Prior Publication Data
US 2019/0154219 A1 May 23, 2019

(30) Foreign Application Priority Data
Jun. 30, 2016 (FR) ...................................... 16 56264

(51) Int. Cl.
F21S 41/14 (2018.01)
F21S 41/141 (2018.01)
(Continued)

(52) U.S. Cl.
CPC ............. *F21S 41/141* (2018.01); *C09K 11/02* (2013.01); *C09K 11/08* (2013.01); *F21K 2/00* (2013.01);
(Continued)

(58) Field of Classification Search
CPC ...... F21S 41/141; H01L 33/502; H01L 33/08; C09K 11/08
See application file for complete search history.

(56) References Cited

U.S. PATENT DOCUMENTS

2006/0061254 A1* 3/2006 Chen ....................... H01J 63/06
313/495
2012/0132888 A1 5/2012 Kwak et al.
(Continued)

FOREIGN PATENT DOCUMENTS

EP 2 386 793 A1 11/2011
WO WO 2017/025440 A1 2/2017

OTHER PUBLICATIONS

International Search Report dated Sep. 13, 2017 in PCT/EP2017/065659 filed on Jun. 26, 2017.

Primary Examiner — William Coleman
(74) Attorney, Agent, or Firm — Oblon, McClelland, Maier & Neustadt, L.L.P.

(57) ABSTRACT

A light-emitting module for an automotive vehicle includes a light source including a plurality of electroluminescent rods, and a layer adapted for encapsulating the electroluminescent rods and for converting at least a portion of the light emitted by the rods into a converted light, the layer including a conversion sublayer extending beyond a free end of the electroluminescent rods, the conversion sublayer including a phosphor compound adapted for generating the converted light from the light emitted by the electroluminescent rods, the phosphor compound being in the form of grains, the dimensions of which are provided to prevent the presence of the grains between spaces delimited laterally between the rods, and an encapsulation sublayer in which at least a portion of the electroluminescent rods is embedded.

20 Claims, 2 Drawing Sheets

(51) Int. Cl.

| | |
|---|---|
| C09K 11/02 | (2006.01) |
| C09K 11/08 | (2006.01) |
| H01L 33/08 | (2010.01) |
| H01L 33/50 | (2010.01) |
| F21S 43/14 | (2018.01) |
| F21K 2/00 | (2006.01) |
| H01L 33/56 | (2010.01) |
| H01L 33/18 | (2010.01) |
| B82Y 20/00 | (2011.01) |
| H01L 33/24 | (2010.01) |
| F21Y 115/10 | (2016.01) |
| B60Q 1/14 | (2006.01) |

(52) U.S. Cl.
CPC .............. *F21S 43/14* (2018.01); *H01L 33/08* (2013.01); *H01L 33/502* (2013.01); *H01L 33/508* (2013.01); *H01L 33/56* (2013.01); *B60Q 1/14* (2013.01); *B82Y 20/00* (2013.01); *F21Y 2115/10* (2016.08); *H01L 33/18* (2013.01); *H01L 33/24* (2013.01); *H01L 2933/005* (2013.01); *H01L 2933/0041* (2013.01)

(56) References Cited

U.S. PATENT DOCUMENTS

| | | |
|---|---|---|
| 2014/0175978 A1 | 6/2014 | Kobayashi |
| 2015/0207038 A1 | 7/2015 | Hwang et al. |
| 2016/0172339 A1 | 6/2016 | Do |

\* cited by examiner

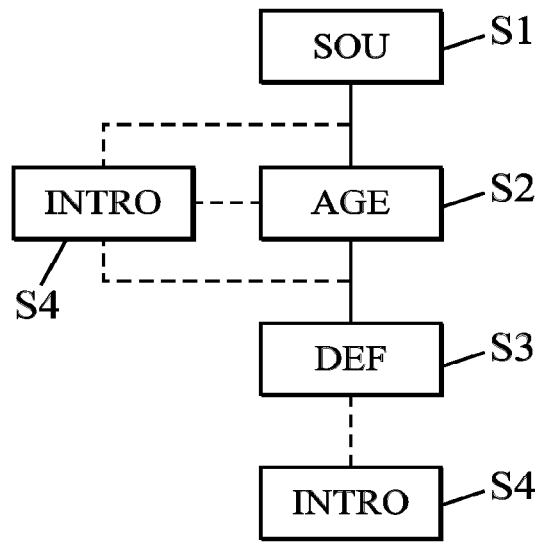
FIG. 3
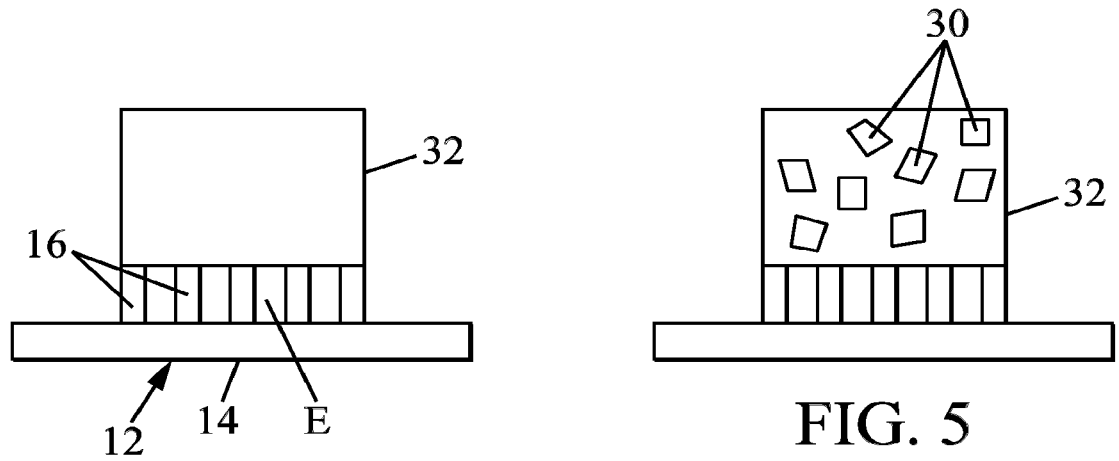
FIG. 4
FIG. 5

LIGHTING AND/OR SIGNALLING DEVICE, MORE PARTICULARLY FOR AN AUTOMOTIVE VEHICLE

The field of the invention concerns lighting and/or signalling devices, more particularly for an automotive vehicle.

The lighting and/or signaling devices generally comprise a light-emitting module adapted for generating light.

Among modules of this type, modules are known in which the light-emitting core comprises a light-emitting device based on the use of classical electroluminescent diodes.

This light-emitting core can be combined with a conversion layer near the diodes and configured for converting at least a portion of the light emitted by the diodes into a converted light. The converted light causes the device to emit a resulting light of a selected color, optionally by means of combination with the light emitted by the diodes, which is not absorbed by the conversion layer.

One of the difficulties associated with this type of configuration is that of obtaining a conversion layer having favourable properties, and more particularly that of obtaining a colour provided by the module having low variability according to the direction of observation.

The invention is thus intended to improve this situation.

For this purpose, the invention relates to a light-emitting device, more particularly for an automotive vehicle, the light-emitting device comprising:
 a plurality of electroluminescent rods of submillimetre dimensions configured to emit light, and
 a coating adapted for encapsulating the electroluminescent rods and for converting at least a portion of the light emitted by the rods into a converted light, the coating comprising:
  a coating material in which at least a portion of the electroluminescent rods is embedded, and
  a conversion material adapted for generating said converted light from the light emitted by the electroluminescent rods, the conversion material comprising a plurality of phosphor grains, the phosphor grains being located in an area of the coating extending beyond free ends of the electroluminescent rods, and the phosphor grains having dimensions configured to prevent the presence of said phosphor grains between spaces delimited laterally between the electroluminescent rods.

According to one aspect of the invention, the electroluminescent rods are embedded in the coating material.

According to one aspect of the invention, at least a portion of the phosphor grains is accumulated in a thickness of the coating which extends beyond the free end of the electroluminescent rods.

According to one aspect of the invention, said thickness is in contact with the free end of the electroluminescent rods.

According to one aspect of the invention, said area of the coating has a thickness of between 10 and 100 μm.

According to one aspect of the invention, for at least a portion of the electroluminescent rods, adjacent electromagnetic rods laterally define spaces between them, the grains having a minimum diameter greater than the largest distance of a group of distances between two electroluminescent rods jointly defining one of said spaces.

According to one aspect of the invention, the coating material comprises a thermoplastic or thermosetting polymer.

According to one aspect of the invention, said material comprises a polysiloxane.

According to one aspect of the invention, the phosphor grains comprise at least one phosphor compound taken alone or in combination from: $Y_3Al_5O_{12}:Ce^{3+}$(YAG), $(Sr,Ba)_2SiO_4:Eu^{2+}$, $Ca_x(Si,Al)_{12}(O,N)_{16}:Eu^{2+}$, $CaAlSiN_3:Eu^{2+}$, $Ca_2Si_5N_8:Eu^{2+}$, $La_2O_2S:Eu^{3+}$, $(Sr,Ca,Ba,Mg)_{10}(PO_4)_6Cl_2:Eu^{2+}$, $BaMgAl_{10}O_{17}:Eu^{2+}$, $(Si,Al)_6(O,N):Eu^{2+}$, $BaMgAl_{10}O_{17}:Eu^{2+}Mn^{2+}$, $SrS:Eu^{2+}$, $Sr_2Si_5N_8:Eu^{2+}$, $SrGa_2S_4:Eu^{2+}$, and $(Y,Gd)_3(Al,Ga)_5O_{12}:Ce^{3+}/(Ba,Sr,Ca)Si_2O_4:Eu^{2+}$.

According to one aspect of the invention, the light-emitting module comprises a light-emitting device according to any of the preceding claims.

According to one aspect of the invention, the light-emitting module also comprises a substrate from which the electroluminescent rods extend.

According to one aspect of the invention, the light-emitting module also comprises a control module adapted for controlling the supply of electric power to the electroluminescent rods.

According to one aspect of the invention, the light-emitting module also comprises shaping optics arranged for receiving the light emitted by the light-emitting module in order to form a light beam.

The invention also relates to a light-emitting device, more particularly for an automotive vehicle, comprising a light-emitting module as defined above.

According to one aspect of the invention, the light-emitting device also comprises shaping optics adapted for receiving the light via the light-emitting module for forming an output beam of the light-emitting device.

According to one aspect of the invention, the light-emitting device is configured to implement a photometric function, more particularly a regulatory function.

The invention also relates to a method for producing a light-emitting device according to any of the preceding claims, the method comprising:
 a step of obtaining the electroluminescent rods,
 a formation step during which is formed, on the electroluminescent rods of the light source, a preparation layer intended to form all or part of the coating adapted for encapsulating the electroluminescent rods and for converting at least a portion of the light emitted by the rods into a converted light,
 a deformation step during which the preparation layer is deformed so as to fill spaces delimited laterally between the rods, and
 a step following the deformation step during which the coating is formed from at least the preparation layer.

According to one aspect of the invention, the method also comprises an introduction step before or after the formation step and/or the deformation step during which the phosphor grains are introduced into a material from which the preparation layer is produced into the preparation layer or into a material obtained from the preparation layer.

According to one aspect of the invention, the introduction step takes place before the formation step, the phosphor grains being introduced into the material from which the preparation layer is produced.

According to one aspect of the invention, the introduction step takes place after the formation step, the phosphor grains being introduced into the preparation layer.

According to one aspect of the invention, the introduction step takes place after the deformation step, the phosphor grains being introduced into the preparation layer once the preparation layer is deformed.

According to one aspect of the invention, the material of the preparation layer comprises a precursor of the coating material, the precursor being converted into the coating material for forming the coating from the preparation layer.

According to one aspect of the invention, the introduction step takes place after the conversion of the precursor into the coating material, the phosphor grains being introduced into the coating material in order to form the coating.

According to one aspect of the invention, the preparation layer is thermoplastic, and during the deformation step, the preparation layer is heated in order to deform it.

According to one aspect of the invention, the preparation layer is thermosetting, and after the deformation step, at least the encapsulation sublayer is heated in order to cure it.

The invention will be better understood after reading the following detailed description, given solely by way of example and with reference to the attached figures, which show the following:

FIG. 3 is a block diagram illustrating a method for producing the emission module of FIG. 2; and FIGS. 4 and 5 illustrate the steps of the method of FIG. 3.

FIG. 1 illustrates a light-emitting device 2 according to the invention configured for emitting light.

The device is advantageously a device intended to be incorporated into an automotive vehicle. Advantageously, the light-emitting device 2 is a lighting and/or signaling device of an automotive vehicle.

For example, it is configured to implement one or a plurality of photometric functions.

For example, a photometric function is a function of illumination and/or signaling that is visible to the human eye. It will be noted that these photometric functions may be subject to one or more regulations establishing the requirements of colorimetry, intensity, spatial distribution in accordance with a grid referred to as a photometric grid, or ranges of visibility of the light emitted.

The light-emitting device 2 is for example a lighting device and constitutes a vehicle lamp—or a front headlight. It is then configured to implement one or a plurality of photometric functions selected, for example, from a low beam function referred to as a "function code" (UNECE Regulations 87 and 123), a position light function (UNECE Regulation 007), a high beam light function referred to as a "high beam function" (UNECE Regulation 123), and an anti-fog function (UNECE Regulations 019 and 038).

Alternatively, the device is a signaling device intended to be arranged in the front or back of the vehicle.

When the device is intended to be arranged at the front, these photometric functions include a function for indicating a change of direction (UNECE Regulation 006), a daytime illumination function known by the English acronym DRL (UNECE Regulation 087), for "Daytime Running Light", and a front light signature function.

When it is intended to be arranged at the rear, these photometric functions include a reverse indicating function (UNECE Regulation 023), a stop function (UNECE Regulation 007), an anti-fog function (UNECE Regulations 019 and 038), a change of direction indicating function (UNECE Regulation 006), and a rear light signature function.

Alternatively, the light-emitting device 2 is provided for illuminating the passenger compartment of a vehicle and is then intended to emit light mainly inside the passenger compartment.

In the following, the light-emitting device 2 is described in a non-limiting manner in a configuration in which it is intended to emit light outside the vehicle.

Figure 1:
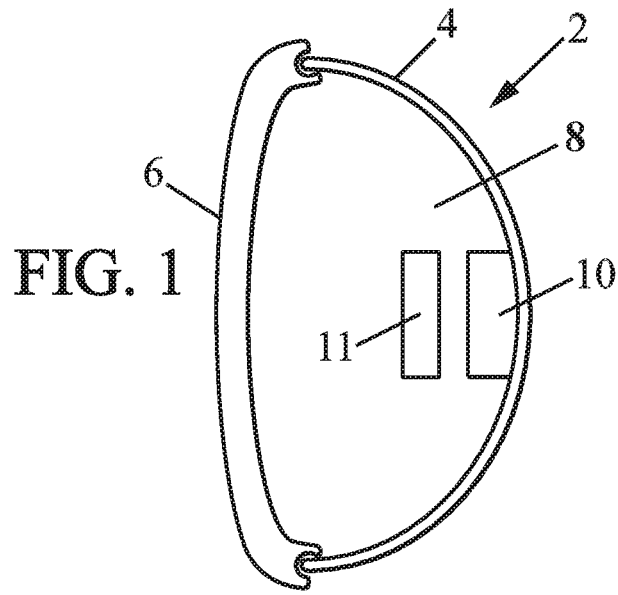
FIG. 1 is an illustration of a light-emitting device, more particularly a lighting and/or signaling device according to the invention.

Referring to FIG. 1, the light-emitting device 2 comprises a housing 4 and a cover glass 6 cooperating with each other to internally delimit a cavity 8.

The light-emitting device 2 also comprises a light-emitting module 10 according to the invention, referred to hereafter as module 10, arranged completely or partially in the cavity 8. Optionally, the light-emitting device 2 also comprises shaping optics 11 arranged to receive a portion of the light emitted by the module 10 for forming an output beam of the light-emitting device 2 (optionally jointly with the glass 6).

The term shaping optics is understood to refer to an element adapted for deflecting at least one of the light beams emitted by the module 10. Here, this element 11 is for example configured to form a beam directed toward the glass 6.

The module 10 is configured for emitting light. For example, in the example of FIG. 1, it is arranged for emitting light in the direction of the element 11.

Figure 2:
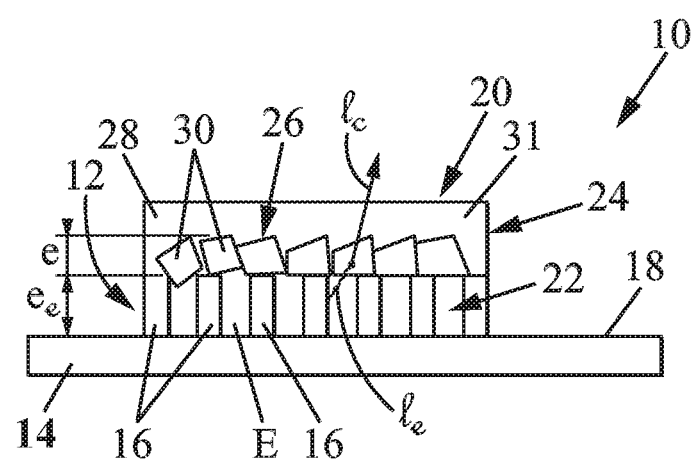
FIG. 2 is an illustration of a light-emitting module according to the invention.

Referring to FIG. 2, the module 10 comprises a light source 12 configured for emitting light and a substrate 14.

The light source 12 forms the light-emitting core of the module 10 and the light-emitting device 2 (optionally jointly with other light-emitting modules).

In the context of the invention, the light source 12 is a semiconductor light source. In other words, it comprises at least one semiconductor element adapted for emitting light or electromagnetic radiation. In the context of the invention, the light source 12 comprises electroluminescent units 16 of submillimetre dimensions adapted for emitting light or electromagnetic radiation. These units correspond for example to rods.

More particularly, the electromagnetic radiation may be in the ultraviolet radiation region.

The following description is given in a non-limiting manner in a context in which the units are rods.

The substrate 14 forms a support for the rods 16. The substrate 14 is adapted to supply electrical energy to the rods 16. For this purpose, it comprises one or a plurality of metallised tracks adapted to supply electrical energy from an electrical source (not shown) to the rods 16. This track or tracks is/are advantageously configured for connecting all or a portion of the rods among themselves in order to define one or a plurality of sub-groups of rods 16, and for allowing the selective supply of this or these sub-group(s). Control of the power supply to the sub-groups is advantageously carried out via the intermediary of a control module forming part of the module 10.

The substrate 14 is in the form of a plate. For example, the substrate is substantially planar.

The substrate is for example composed of silicon or silicon carbide.

The substrate comprises a surface 18, with the rods 16 being arranged in contact with said surface. The rods 16 are for example arranged on a central area of this surface 18, which optionally has edges not bearing a rod 16.

Optionally, the module 10 comprises a heat sink configured for dissipating the heat generated by the electroluminescent rods. The heat sink is for example connected to the substrate at a surface thereof opposite the surface 18.

The rods 16 are configured to emit light or electromagnetic radiation. For example, the rods 16 are configured to emit blue, red, or green light or electromagnetic radiation in the ultraviolet radiation region.

The rods 16 are in the form of posts of small size having one or more lateral surfaces and one free end opposite the substrate. This end is for example in the form of a surface of an end. The rods are adapted for emitting light or electromagnetic radiation via their lateral surfaces. Optionally, they also emit light or electromagnetic radiation via the end surface.

The rods 16 project from the surface 18 of the substrate 14. The rods 16 extend for example substantially parallel to one another. For example, they extend perpendicularly to the substrate.

Each rod 16 has for example a general cylindrical form extending along a longitudinal axis. For example, they have a circular or polygonal section. Alternatively, they have a section of any desired shape.

The rods 16 are of submillimetre dimensions. In other words, their dimensions are less than a millimetre. Moreover, they have a height greater than or equal to one micrometre. For example, this height is between 2 and 10 µm.

Because of the presence of these rods 16, the source 12 is a light source with semiconductors in three dimensions, in contrast to light sources composed of light-emitting elements of the electroluminescent diode type, which form substantially planar sources in the form of a thin layer, their thickness being on the order of several nanometres.

The rods 16 are for example composed of gallium nitride (GaN), an alloy of aluminium nitride and gallium nitride (AlGaN), or an alloy of aluminium, indium, gallium and/or phosphorus (AlInGaP).

For example, the rods are formed on the substrate 14 by epitaxial growth.

The rods 16 comprise a core, for example of gallium nitride, around which are arranged quantum wells formed by superposing layers of various materials, for example gallium nitride and gallium-indium nitride. Moreover, they comprise a shell surrounding the quantum wells, for example also made of gallium nitride. This shell is for example coated with a layer of transparent conductive oxide (TCO), which forms an anode of the rod that is complementary to the cathode formed by the substrate 14.

The rods 16 are arranged on the substrate 14 so as to define at least one light-emitting area having a high rod density. For example, in this area, the rods are regularly distributed, for example according to a substantially matrix-type arrangement organised according to two directions. These directions are orthogonal, the rods being arranged in rows and columns. Alternatively, the arrangement of the rods in an emission area can be any desired arrangement.

The rods of an emission area laterally define spaces E between them. These spaces E are located between the lateral surfaces of the adjacent rods in the arrangement of the rods. For example, more specifically, a given space E is delimited between the lateral surfaces of four adjacent rods 16. It will be noted that these spaces E are intercommunicating between the rods.

Still referring to FIG. 2, the light source 12 also comprises a coating 20 adapted for encapsulating the rods 16 and for converting at least a portion of the emitted light or the electromagnetic radiation emitted by the rods 16 into a converted light. The emitted light or the electromagnetic radiation emitted by the rods 16 is labelled $l_e$ in FIG. 2, and the converted light is labelled $l_c$.

The coating 20 is in contact with the rods 16. The coating 20 is advantageously also in contract with the substrate 14. The coating extends beyond the free end of the rods. In practice, advantageously, the coating is in the form of a layer in contact with the substrate and whose thickness is greater than the vertical height of the rods (relative to the orientation of FIG. 2).

The coating has a thickness for example of between 10 and 100 µm.

The coating 20 comprises a coating material 22 and a conversion material 24.

The coating material 22 forms a matrix of the coating in which the conversion material is arranged. The coating material then defines the general shape of the coating, and more specifically its general layer configuration.

The coating material 22 is configured for protecting the rods 16. For example, it is configured for protecting the mechanically and/or chemically. Moreover, it is transparent for the emitted light or the electromagnetic radiation emitted by the rods.

For this purpose, the rods 16 are at least partially embedded in the coating material 22. Advantageously, the rods 16 are integrally embedded in the coating material 22.

The coating material advantageously comprises a polysiloxane.

The conversion material 24 is arranged in the coating material 22. It is configured for converting at least a portion of the emitted light $l_e$ or the radiation emitted by the rods into the converted light $l_c$. In the context of the invention, the conversion material 24 comprises at least one phosphor compound 26.

Here, the term phosphor is understood to refer to a luminescent material designed to absorb at least a portion of an emitted excited light or excited electromagnetic radiation emitted by a light source and to convert at least a portion of this absorbed excited light or this excited absorbed electromagnetic radiation into emitted light having a wavelength different from that of the excited light or that of the excited electromagnetic radiation. Here, these lights therefore correspond to the emitted light or emitted electromagnetic radiation $l_e$ and to the converted light $l_c$.

In the context of the invention, the conversion material 24 is configured to absorb all of the emitted light or all the electromagnetic radiation emitted by the rods in the direction of the cover glass, or only a portion thereof.

In practice, this modality depends on the colour of the light desired for the module 10, which results from the combination of the light $l_e$ that passes through the conversion material 24 without being absorbed therein (if present) and the converted light $l_c$ resulting from the absorption of part of the emitted light $l_e$. The quantity of the phosphor compound 26 (or the conversion material in general) can then be adjusted in order to control the proportion of light that is converted into light $l_c$.

The phosphor compound 26 is in the form of phosphor grains or particles 30 arranged in the coating material 22. The grains 30 are located more specifically in an area 31 of the coating that extends beyond the free end of the rods.

Advantageously, the grains 30 of the conversion sublayer 24 are accumulated in a thickness e of the area 31 that is proximal relative to the rods 16. In other words, the grains 30 are mainly located in the portion of the area of the coating overhanging the rods located closest to the end of the rods 16. Advantageously, they are accumulated in direct contact with the free ends of the rods.

The grains thus define a conversion layer in the coating that overhangs the rods. Advantageously, this conversion layer has a thickness of between 30 µm and 50 µm, for example substantially being 40 µm.

The phosphor compound 26 is advantageously a fluorescent material, i.e. a compound configured for emitting light by fluorescence. Alternatively or additionally, the phosphor compound is phosphorescent.

It will be noted that in certain embodiments, the conversion material 24 comprises more than one phosphor compound.

For example, the conversion material 24 comprises at least one phosphor compound 26 of the following group: $Y_3Al_5O_{12}:Ce^{3+}$(YAG), $(Sr,Ba)_2SiO_4:Eu^{2+}$, $Ca_x(Si,Al)_{12}(O,N)_{16}:Eu^{2+}$, $CaAlSiN_3:Eu^{2+}$, $Ca_2Si_5N_8:Eu^{2+}$, $La_2O_2S:Eu^{3+}$, $(Sr,Ca,Ba,Mg)_{10}(PO_4)_6Cl_2:Eu^{2+}$, $BaMgAl_{10}O_{17}:Eu^{2+}$, $(Si,Al)_6(O,N):Eu^{2+}$, $BaMgAl_{10}O_{17}:Eu^{2+}Mn^{2+}$, $SrS:Eu^{2+}$, $Sr_2Si_5N_8:Eu^{2+}$, $SrGa_2S_4:Eu^{2+}$, and $(Y,Gd)_3(Al,Ga)_5O_{12}:Ce^{3+}/(Ba,Sr,Ca)Si_2O_4:Eu^{2+}$.

The phosphor compounds $Y_3Al_5O_{12}:Ce^{3+}$(YAG), $(Sr,Ba)_2SiO_4:Eu^{2+}$ and $Ca_x(Si,Al)_{12}(O,N)_{16}:Eu^{2+}$ are configured to at least partially absorb blue excited light and emit yellow light in response.

The phosphor compounds $SrS:Eu^{2+}$ and $Sr_2Si_5N_8:Eu^{2+}$ are configured to at least partially absorb blue excited light and emit red light in response.

The phosphor compound $(Y,Gd)_3(Al,Ga)_5O_{12}:Ce^{3+}/(Ba,Sr,Ca)Si_2O_4:Eu^{2+}$ is configured to at least partially absorb a blue excited light and emit white light in response.

The phosphor compounds $(Si,Al)_6(O,N):Eu^{2+}$, $BaMgAl_{10}O_{17}:Eu^{2+}Mn^{2+}$, and $SrGa_2S_4:Eu^{2+}$ are configured to at least partially absorb ultra-violet excited electromagnetic radiation and emit green light in response.

The phosphor compounds $(Sr,Ca,Ba,Mg)_{10}(PO_4)_6Cl_2:Eu^{2+}$ and $BaMgAl_{10}O_{17}:Eu^{2+}$ are configured to at least partially absorb ultra-violet excited electromagnetic radiation and emit blue light in response.

The phosphor compounds $CaAlSiN_3:Eu^{2+}$, $Ca_2Si_5N_8:Eu^{2+}$, and $La_2O_2S:Eu^{3+}$ are configured to at least partially absorb ultra-violet excited electromagnetic radiation and to emit red light in response.

In a variant embodiment, the phosphor compounds do not absorb all of the excited light. It is thus possible to obtain additive synthesis between the excited light and the light emitted by the luminophore. The phosphor compounds $Y_3Al_5O_{12}:Ce^{3+}$(YAG), $(Sr,Ba)_2SiO_4:Eu^{2+}$, and $Ca_x(Si,Al)_{12}(O,N)_{16}:Eu^{2+}$ thus make it possible to obtain white light due to the additive synthesis of blue excited light and the light admitted in response, which is then yellow.

The phosphor grains 30 are of any desired shape.

In the context of the invention, the grains 30 show dimensions adapted for preventing the presence of grains in the spaces E delimited laterally between the rods 16. More specifically, the dimensions of the grains 30 are configured to prevent the presence of grains 30 between the rods of a given emission area.

Here, the phrase "presence of grains between the rods" is understood to mean that the grains are not integrally located in the spaces E. Advantageously, at most one end portion of one or a plurality of grains is located between the rods, in which case it is at the level of the free ends of the rods opposite the substrate 14, as shown for the grain farthest to the left in FIG. 2.

For this purpose, the grains 30 have dimensions greater than the maximum dimensions allowing the presence of the grains 30 in the spaces E between the rods 16, and this regardless of the proposed orientation of the grains.

The value of these maximum dimensions varies depending on the arrangement of the rods 16 on the substrate 14, the configuration of the rods and the shape of each grain.

Here, the term "particle diameter" refers to the length of a segment joining two points on the surface of the particle and passing through the centre of gravity of the particle. A given particle 30 of any shape has a plurality of diameters, including a minimum diameter and a maximum diameter.

Moreover, in the context of the invention, the minimum grain diameter 30 is advantageously greater than the greatest distance of the group of distances between two rods jointly defining a given space E (optionally jointly with one or a plurality of other rods), and this for the group of rods of the emission area.

In other words, for a given space E, one considers the greatest of the distances between two of the rods defining the space E. One then considers the greatest of these distances among the group of spaces E. This distance then advantageously constitutes the lower limit (preferably strictly) of the minimum grain diameter 30. It will be noted that for a regular matrix arrangement, the maximum distance for a space E is substantially the same as for the other spaces E.

Alternatively, it is the maximum diameter of the grains 30 that is greater than this distance.

For example, for a matrix arrangement of the rods, this distance is defined by two rods belonging to distinct rows and columns. The minimum grain diameter 30 is greater than $\sqrt{p1^2+p2^2}$, where p1 and p2 are the pitch spacing of the rods according to the two directions of the matrix arrangement.

More precise characterisation of the minimum grain diameter is proposed based on the scale referred to as the "Krumbein phi" scale.

For example, for a spacing of the adjacent rods of between 3 μm and 10 μm, the minimum grain diameter corresponds to a φ value scale. For a spacing of between 3 μm and 10 μm, the minimum diameter corresponds to a φ value scale.

It will be noted that in a configuration in which the module 10 has a plurality of light-emitting areas, all of which are encapsulated by the coating 20 and separated by buffer spaces not having rods, the possibility cannot be ruled out that there may be grains 30 present in the buffer spaces between the emission areas that do not correspond to the spaces E delimited by of the neighbouring rods. Moreover, for an emission area having at least one area free of rods, one cannot rule out the possibility that grains 30 are present in this or these area(s), which are then also not defined between the adjacent rods.

The method of functioning of the module 10 and the light-emitting device 2 will now be described with reference to the figures.

When the rods 16 are supplied with electrical energy by the substrate, they emit light or electromagnetic radiation referred to as exciting light $l_e$. At least a portion of this exciting light or electromagnetic radiation has a path that intersects with at least one grain 30. At least a portion of this exciting light or electromagnetic radiation is then absorbed by one or more grains of the (or a) phosphor compound. In response, the phosphor compound 26 emits the converted light $l_c$, in a substantially isotropic manner, advantageously by fluorescence. At least a portion of the light $l_e$ that is not absorbed is emitted in the direction of the cover glass 6, and at least a portion of the converted light is also emitted in the direction of the cover glass. This light passes through the glass, optionally after being shaped by the shaping optics 11, and/or passes through shaping optics of the module 10 arranged facing the rods and the coating.

A production method of the module 10 will now be described with reference to the figures, more particularly FIG. 3.

In general, the production method comprises the following:

a step S1 of obtaining the light source 12, a formation step S2 during which is formed, on the electroluminescent rods 16 of the light source 12, a preparation layer 32 intended to form all or part of the coating, a deformation step S3 during which the preparation layer 32 is deformed so as to fill the spaces E delimited laterally between the rods, and a step following the deformation step during which the coating is formed from at least the preparation layer.

The method also comprises an introduction step S4 during which the grains 30 of the phosphor compound are introduced in the production method.

The details on the course of the production method vary depending on when this introduction step is carried out.

Referring to FIG. 5, which shows the result of step S2 in the context of a first embodiment, the grains 30 are introduced into a material from which the preparation layer 32 is produced before the formation of the preparation layer 32 on the rods 16.

Regardless of the embodiment proposed, the layer 32 is for example in the form of a layer located on the rods. At least immediately after it is formed, its material does not fill the spaces E located between the rods. Advantageously, the preparation layer is formed by means of a mould that prevents the transfer of the material of the layer 32 toward undesirable areas.

For example, the layer 32 is formed over the entire emission area in question in integral fashion or in successive portions.

For introducing grains 30 in the method prior to formation of the layer 32, one proceeds for example in a continuous manner while mixing the material in question and the grains so as to embed them in this material.

The material in question is advantageously a precursor of the material intended to form the coating material. For example, it is a precursor of polysiloxane.

Moreover, in this embodiment, the grains 30 are introduced into this material, after which the mixture obtained is disposed on the rods 16 so as to form the preparation layer 32.

In a second embodiment, with reference to FIGS. 4 and 5, the grains 30 are introduced after the formation of the preparation layer 32 on the rods 16.

For example, the grains are then inserted into the material of the preparation layer by the upper interface of the layer 32 (in the direction of orientation of FIG. 5).

Once the preparation layer 32 is formed on the rods 16, during the deformation step, the layer 32 is deformed such that its material fills the spaces E.

During the deformation step, the material of the preparation layer 32 (other than the grains it contains) drops or melts to fill the spaces E between the rods. Because of the material transfer, and optionally under the combined action of gravity, the grains 30 tend to move in the direction of the end of the rods opposite the substrate 14, where they accumulate in the thickness e described above because of their dimensions. This results in formation of the conversion layer, which is then advantageously located closest to the ends of the rods 16.

Advantageously, a mould surrounding all or part of the emission area in question is used to prevent the transfer of the material of the layer 32 in question toward undesired areas during formation of the latter, as well as the edges of the substrate.

Several embodiments of the deformation step are proposed.

In a first embodiment, the material of the preparation layer 32 (other than the grains 30 that have optionally already been introduced) is a thermoplastic material.

In addition, during the deformation step, this material is caused to deform by applying heat. Under the effect of this heat, the material becomes deformable and melts so as to fill the spaces E between the rods 16.

In a second embodiment, the material of the preparation layer 32 is thermosetting. In other words, the material is initially deformable and hardens under the effect of the heat.

During the deformation step, once the preparation layer 32 is formed on the rods 16, it deforms naturally because of the plastic nature of the material of the layer 32. The material of the layer 32 then moves in the direction of the substrate so as to fill the spaces E.

As described above, because of the transfer of material of the layer 32 toward the substrate, the grains 30 tend to move in the direction of the ends of the rods 16 and accumulate on or near these ends because of their dimensions, which prevent them from dropping between the rods.

Once the configuration of the desired preparation layer is obtained, this shape is solidified. For example, to do so, the coating is cooled if it is a thermoplastic or heated if it is thermosetting.

Referring to FIG. 4, in a third embodiment relative to step S4, the grains 30 are introduced once the deformation step is completed.

In other words, the preparation layer 32 subjected to the deformation step is free of grains 30, said grains being introduced into the material resulting from deformation of the layer 32 that extends beyond the end of the rods 16 once the deformation step has been carried out.

For this purpose, for example and as described above, the grains 30 are inserted into this material via the upper interface of this layer so as to form a sublayer 24.

For effective formation of the coating from the preparation layer deformed in the configuration in which the coating material results from the conversion of a precursor (which corresponds to the material of the preparation layer other than the grains), this precursor is converted into the coating material. For example, one uses a method known for this purpose such as polymerisation.

In a variant relative to the introduction step also shown in FIG. 3, the introduction step is carried out after conversion of the precursor into the coating material. In other words, the preparation layer is free of grains, it is then deformed, after which it is converted in order to form the coating material. The grains are then introduced directly into the coating material. This introduction is carried out for example by the upper surface of the layer formed by the coating material.

It will be noted that in this variant, it is more difficult to obtain a homogeneous conversion layer near the free end of the rods.

The module according to the invention has several advantages.

First of all, the configuration of the encapsulation layer 20, and in particular the absence of grains between the rods, has the effect of improving the spatial homogeneity of the colour obtained following conversion of the light emitted by the phosphor compound.

Moreover, this effect is reinforced by the accumulation of the grains at the end of the rods. Indeed, this configuration of the grains results in the presence of a conversion layer that is compact and shows favourable homogeneity at the end of the rods, which has the effect of harmonising the phenomena to which the light emitted by the various rods is subjected.

Moreover, the module is obtained by means of a simple and adaptable production method, which makes it possible to emulate the method of depositing a thin conversion layer, which is not easy with phosphor compounds, which are generally in the form of grains.

The invention claimed is:

1. Light-emitting source, the light-emitting source comprising:
   a plurality of electroluminescent rods of submillimetre dimensions configured to emit light, and
   a coating adapted for encapsulating the electroluminescent rods and for converting at least a portion of the light emitted by the rods into a converted light, the coating comprising:
   a coating material in which at least a portion of the electroluminescent rods is embedded, and
   a conversion material adapted for generating said converted light from the light emitted by the electroluminescent rods, the conversion material comprising a plurality of phosphor grains, the phosphor grains being located in an area of the coating extending beyond free ends of the electroluminescent rods, and the phosphor grains having dimensions configured to prevent the presence of said phosphor grains between spaces delimited laterally between the electroluminescent rods.

2. Light-emitting source according to claim 1, wherein the electroluminescent rods are embedded in the coating material.

3. Light-emitting source according to claim 1, wherein at least a portion of the phosphor grains is accumulated in a thickness of the coating which overhangs the free end of the electroluminescent rods.

4. Light-emitting source according to claim 1, wherein said area of the coating has a thickness of between 10 and 100 µm.

5. Light-emitting source according to claim 1, wherein, for at least a portion of the electroluminescent rods, adjacent electromagnetic rods laterally define spaces between them, the grains having a minimum diameter greater than the largest distance of a group of distances between two electroluminescent rods jointly defining one of said spaces.

6. Light-emitting source according to claim 1, wherein the coating material comprises a thermoplastic or thermosetting polymer.

7. Light-emitting source according to claim 1, wherein the phosphor grains comprise at least one phosphor compound taken alone or in combination from: $Y_3Al_{15}O_{12}:Ce^{3+}$(YAG), $(Sr,Ba)_2SiO_4:Eu^{2+}$, $Ca_x(Si,Al)_{12}(O,N)_{16}:Eu^{2+}$, $CaAlSiN_3:Eu^{2+}$, $Ca_2Si_5N_8:Eu^{2+}$, $La_2O_2S:Eu^{3+}$, $(Sr, Ca, Ba, Mg)_{10}(PO_4)_6Cl_2:Eu^{2+}$, $BaMgAl_{10}O_{17}:Eu^{2+}$, $(Si,Al)_6(O,N):Eu^{2+}$, $BaMgAl_{10}O_{17}:Eu^{2+}+Mn^{2+}$, $SrS:Eu^{2+}$, $Sr_2Si_5N_8:Eu^{2+}$, $SrGa_2S_4:Eu^{2+}$, and $(Y,Gd)_3(Al,Ga)_5O_{12}:Ce^{3+}/(Ba,Sr,Ca)Si_2O_4:Eu^{2+}$.

8. Light-emitting module adapted for emitting light, the light-emitting module comprising a light-emitting source according to claim 1.

9. Method for producing a light-emitting source according to claim 1, the method comprising:
   a step of obtaining the electroluminescent rods,
   a formation step during which is formed, on the electroluminescent rods of the light source, a preparation layer intended to form all or part of the coating adapted for encapsulating the electroluminescent rods and for converting at least a portion of the light emitted by the rods into a converted light,
   a deformation step during which the preparation layer is deformed so as to fill spaces delimited laterally between the rods, and
   a step following the deformation step during which the coating is formed from at least the preparation layer.

10. Light-emitting source according to claim 2, wherein at least a portion of the phosphor grains is accumulated in a thickness of the coating which overhangs the free end of the electroluminescent rods.

11. Light-emitting source according to claim 2, wherein said area of the coating has a thickness of between 10 and 100 µm.

12. Light-emitting source according to claim 2, wherein, for at least a portion of the electroluminescent rods, adjacent electromagnetic rods laterally define spaces between them, the grains having a minimum diameter greater than the largest distance of a group of distances between two electroluminescent rods jointly defining one of said spaces.

13. Light-emitting source according to claim 3, wherein said thickness is in contact with the free end of the electroluminescent rods.

14. Light-emitting source according to claim 6, wherein said coating material comprises a polysiloxane.

15. Light-emitting module according to claim 8, also comprising a substrate from which the electroluminescent rods extend.

16. Light-emitting module according to claim 8, also comprising a control module adapted for controlling the supply of electric power to the electroluminescent rods.

17. Light-emitting module according to claim 8, also comprising shaping optics arranged for receiving the light emitted by the light-emitting module in order to form a light beam.

18. Light-emitting device, comprising a light-emitting module according to claim 8.

19. Light-emitting device according to claim 18, wherein the light-emitting device also comprises shaping optics adapted for receiving the light emitted by the light-emitting module for forming an output beam of the light-emitting device.

20. Light-emitting device according to claim 18, the device being configured to implement a photometric function.

* * * * *